United States Patent [19]
Matsunaga et al.

[11] Patent Number: 5,851,641
[45] Date of Patent: Dec. 22, 1998

[54] ELECTROSTATIC CHUCKING DEVICE

[75] Inventors: Tadao Matsunaga, Shizuoka; Takaya Matsushita, Yokkaichi; Kei Hattori, Yokohama, all of Japan

[73] Assignees: Tomoegawa Paper Co., Ltd., Tokyo; Kabushiki Kaisha Toshiba, Kanagawa-ken, both of Japan

[21] Appl. No.: 848,625

[22] Filed: Apr. 29, 1997

Related U.S. Application Data

[62] Division of Ser. No. 561,731, Nov. 22, 1995, Pat. No. 5,645,921.

[30] Foreign Application Priority Data

Nov. 22, 1994 [JP] Japan ................................. 6-311335

[51] Int. Cl.$^6$ ............................................... B32B 9/00
[52] U.S. Cl. ................... 428/209; 428/195; 428/411.1; 361/234; 279/128; 204/298.01; 204/298.31
[58] Field of Search ....................... 156/60, 345, 640.1; 427/195; 428/411.1, 209; 279/128; 204/298.01, 298.02, 298.31; 219/464, 544; 361/233, 234

[56] References Cited

U.S. PATENT DOCUMENTS

| | | | |
|---|---|---|---|
| 4,384,918 | 5/1983 | Abe ........................................ 156/643 |
| 4,645,218 | 2/1987 | Ooshio et al. .......................... 279/1 M |
| 5,179,498 | 1/1993 | Hongoh et al. ......................... 361/234 |
| 5,221,450 | 6/1993 | Hattori et al. ...................... 204/192.32 |
| 5,528,451 | 6/1996 | Su .......................................... 361/234 |
| 5,532,903 | 7/1996 | Kendall .................................. 361/234 |
| 5,645,921 | 7/1997 | Matsunaga et al. .................... 428/209 |
| 5,663,865 | 9/1997 | Kawada et al. ........................ 361/234 |
| 5,665,260 | 9/1997 | Kawada et al. ........................ 219/464 |
| 5,671,116 | 9/1997 | Husain ................................... 361/234 |
| 5,697,751 | 12/1997 | Takahashi .............................. 414/222 |

FOREIGN PATENT DOCUMENTS 5-87177  12/1993  Japan .

*Primary Examiner*—William Krynski
*Assistant Examiner*—Abraham Bahta
*Attorney, Agent, or Firm*—McDermott, Will & Emery

[57] ABSTRACT

The present invention is to provide an electrostatic chucking device having improved heat conductivity and at the same time increased adsorption area and improved adsorptity as well as having no unevenness on the wafer-provided face. The electrostatic chucking device of the present invention comprises a metal base, an adhesive layer, an electrode layer comprising a metal-deposited or metal-plated layer, and an electrically insulating layer possessing a face for providing a substance to be adhered by suction, laminated thereon in this order. The electrostatic chucking device is produced by a process comprising a stage for forming a metal-deposited or metal-plated layer on one face of a heat resistant film, a stage for providing a photoresist layer on the surface of the electrode layer, carrying out pattern exposure, development, and an etching processing, a stage for forming a semi-cured adhesive layer on the surface of the etched electrode layer, a stage for punching the formed laminated sheet according to the shape of a metal base, and stage for laminating the metal base and the laminate sheet via the above-mentioned adhesive and curing the laminated product.

6 Claims, 4 Drawing Sheets

ELECTROSTATIC CHUCKING DEVICE

This application is a division of application Ser. No. 08/561,731 filed Nov. 22, 1995 now U.S. Pat. No. 5,645,921.

BACKGROUND OF THE INVENTION

1) Field of the Invention

This invention relates to an electrostatic chucking device such as a device for producing an semiconductor integrated circuit which can fix and hold an electrically conductive substance such as a wafer on a prescribed portion of a processor in vacuum, and a process for producing the same, and particularly to an electrostatic chucking device having improved heat conductivity (heat radiation ability or temperature regulating ability) and improved adhesion by suction.

2) Description of Related Art

In the stage for processing a semiconductor wafer, it is required to fix and hold the semiconductor wafer on a prescribed portion of a processor. In particular, in the manufacture of an integrated circuit in which fine patterns are drawn on the semiconductor wafer to form a lot of semiconductor elements, it is necessary to ensure the holding of the semiconductor wafer on a flat face.

In conventional, as means for holding the semiconductor wafer, a chucking device in a mechanical, vacuum (utilizing the difference between fluids) or electric manner has been utilized. Of these, the chucking device in an electric manner, i.e., an electrostatic chucking device, has the merits that even in the case of an uneven semiconductor wafer, it can be fixed in a close manner, the device can easily be handled and easily be used even in vacuum, etc.

When beam particles, etc. are injected and impacted during the processing of the semiconductor wafer, heat energy is generated on the semiconductor wafer. In the case where the heat energy cannot easily be discharged, the local swelling and deformation of the semiconductor wafer will be caused. Consequently, it is necessary that the heat generated during the processing is escaped to the side of the metal base to make temperature distribution on the semiconductor wafer uniform. For this reason, it is desired for the electrostatic chucking device utilizing in these applications to have functions of holding the semiconductor wafer on a prescribed portion without failing and at the same time of having high heat conductivity.

One embodiment of the conventional electrostatic chucking device, for example, as disclosed in Japanese Patent Publication 87177/93, will be described by referring to the drawing. FIG. 4 is a schematic cross-sectional view showing one embodiment of the conventional electrostatic chucking device. A metal base 1 is made up of a highly heat conductive metal such as copper and aluminium. On the metal base 1, in order to regulate the temperature by passing isothermic water, etc., spaces 6 for regulating temperature are provided. While an electrode layer 3a is provided on an upper portion of the metal base 1 so as to have a function of electric chucking, an insulating plastic film 4b is provided between the electrode layer and the metal base in order to avoid any electric shortage among the electrode layer, the metal base and external portions. On the upper portion of the electrode layer 3 provided on the insulating plastic film 4b, a plastic film 4a is provided so as to cause a semiconductor wafer 5 to exhibit adhesion by suction and to protect the metal base 1.

In the above-mentioned electrostatic chucking device, as the electrode material for the electrode layer 3a, a copper foil having a thickness of ½ oz (approximately 18 microns) or 1 oz (approximately 35 microns) is generally used, and as the insulating plastic films 4a and 4b, films having a thickness of approximately 50 microns such as made of polyimide or Teflon are used considering electric characteristics and heat resistance. They are laminated each other via adhesive layers having a thickness of from 10 microns to 50 microns (2a, 2b, 2c).

In the conventional electrostatic chucking device, since the plastic films 4a and 4b are interposed between the semiconductor wafer 5 and the metal base 1 in order to secure mutual electric insulation between the semiconductor wafer 5, the electrode layer 3a and the metal base 1, the function of regulating temperature is poor due to the low heat conductivity thereof. In other words, there poses a problem that a cooling function of the circuit base to the semiconductor wafer is insufficiently acted.

Since a metal foil having a thickness of approximately from 18 to 35 microns is used as the electrode layer, unevenness in approximately the same degree as thickness of the metal foil used as the electric layer occurs between the portion where the electrode exists and the portion where no electrode is existent on the wafer-provided face (suction face) of the electrostatic chucking device. Consequently, there is a problem that the heat conductivity in vacuum becomes locally poor when the semiconductor wafer is fixed by suction, because the semiconductor wafer is separated at the cavity portion. This phenomenon is significant at the outer circumference where no cooling gas is used, and the portion of the width of insulation is co-called in a floated state, causing the problem that the heat conductivity in vacuum becomes poor.

Moreover, an adhesive is used for laminating these materials. However, when being corrugated, since there are large cavities at these bump portions, which is difficult to be filled up by an adhesive and, thus, fine cavities are formed along the bump, the width of insulation against the outer circumference should be widened in relation to dielectric strength. This causes the problem that the adsorption area becomes narrow.

FIG. 5 explains the above state in the conventional electrostatic chucking device, and shows the state that the unevenness is formed on the wafer-provided face of the plastic film, spaces 7 are formed when providing the semiconductor wafer, and cavities 8 are formed along the bump. The other symbols in FIG. 5 are the same as those described above.

SUMMARY OF THE INVENTION

An object of the present invention is therefore to provide an electrostatic chucking device having improved heat conductivity and at the same time increased adsorption area and improved adsorption power as well as having no unevenness on the wafer-provided face.

Another object of the present invention is to provide a process for producing the above-mentioned electrostatic chucking device.

The electrostatic chucking device of the present invention is characterized by comprising a metal base, an adhesive layer, an electrode layer comprising a metal-deposited or metal-plated layer, and an electrically insulating layer possessing a face for providing a substance to be adhered by suction, laminated thereon in this order.

The process for producing the electrostatic chucking device of the present invention is characterized by comprising a stage for forming a metal-deposited or metal-plated layer on one face of a heat resistant film, a stage for providing a photoresist layer on the surface of the electrode layer, and carrying out pattern exposure, development and an etching processing, a stage for providing a semi-cured adhesive layer on the surface of the etched electrode layer, a stage for punching out the formed laminate sheet according to the shape of a metal base, and a stage for laminating the metal base and the laminate sheet via the above-mentioned adhesive and curing the laminated product.

DETAILED DESCRIPTION OF PREFERRED EMBODIMENTS

Figure 1:
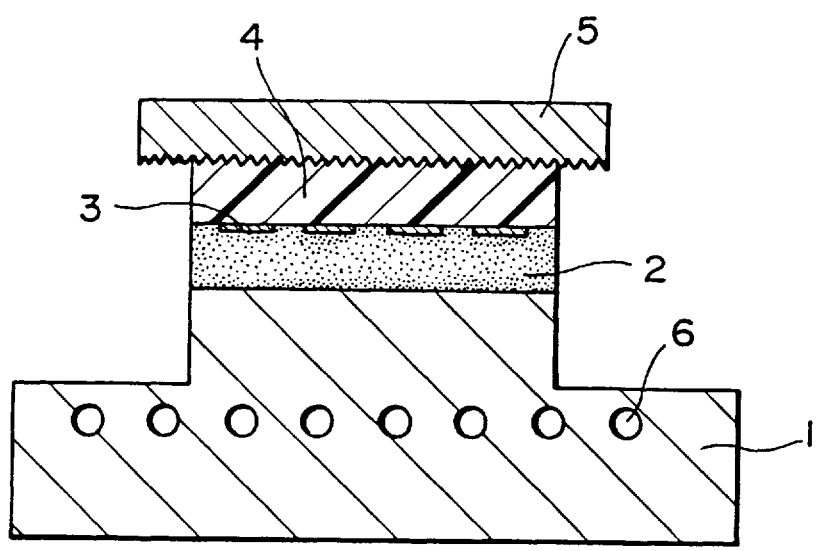
FIG. 1 is a schematic cross-sectional view showing one embodiment of an electrostatic chucking device according to the present invention.

The present invention will now be described in detail by referring to the drawings. FIG. 1 is a schematic cross-sectional view showing one embodiment of an electrostatic chucking device according to the present invention. The electrostatic chucking device of the present invention has a construction where an adhesive layer 2 is formed on a metal base 1, a electrode layer 3 comprising a metal-deposited or metal-plated layer is provided thereon, and an electrically insulating layer 4 comprising a plastic film is provided thereon, the surface of the plastic film making up a face for providing a substance to be adhered by suction. The electrode layer is provided for the purpose of generating a polarization charge on the face of the electrically insulating layer on which a substance to be adsorbed is provided, and is formed by using a metal-deposited or metal-plated layer to form a pattern which meets the metal base. Symbol 5 is a semiconductor wafer and 6 is a space for regulating a temperature.

The metals which is used for deposition or plating, and metal such as copper, aluminium, tin, nickel, and chromium can be used as long as it can easily be deposited or plated and can easily be subjected to pattern formation by wet-etching, etc., and the material is not specifically restricted as long as they provide stable electric conductivity and processing ability.

The thickness of the deposited layer or plated layer is in the range of from 100 angstroms to 10 microns. In the case of a highly reactive material such as aluminium, since the workability is poor and at the same time it is difficult to maintain a stable electric conductivity if the layer thickness is not more 200 angstroms, the thickness is preferably not less than 200 angstroms. The most preferable range of the film thickness of the deposited layer or plated layer is from 500 angstroms to 5 microns, and the layer thickness in this range is most easily used.

The electric insulating layer is a base for forming the electrode layer by the deposition or plating, and an insulating plastic film is used. In the present invention, considering electric characteristics such as $\epsilon$, tan $\theta$, and dielectric strength, a polyimide film having a thickness of from 20 to 75 microns or a heat-resistant plastic film over 150° C. is preferably used, with a polyimide film being most preferably used.

Examples of the polyimide films include Kapton, Dupont, Toray Dupont), Apical (KANEKA CORPORATION), Upilex (Ube Industries, Ltd.), and the like.

Examples of the plastic films having heat resistance over 150° C. include films made of a fluorine resin (e.g., a fluoroethylene-propylene copolymer), polyether sulfone, polyether ether ketone, cellulose triacetate, silicone rubber, etc.

The thickness of the electric insulating layer selected is in the range of from 20 to 75 microns. Although the thickness is preferable as thin as possible in terms of the function, the thickness of approximately 50 microns is preferably selected from the viewpoints of mechanical strength, dielectric strength and durability.

The adhesive layer (insulating layer) used for adhering these materials to the metal base is required to comprise an adhesive having an adhesion force to the three materials, i.e., the electric insulating layer, the electrode layer, and the metal base, and having excellent heat resistance. A thermosetting adhesive, a two-liquid ingredient system curable adhesive, or a thermoplastic adhesive is used.

Examples of effective adhesives are epoxy, polyimide, modified polyimide, rubber, polyamideimide, polyester type adhesives, and these adhesives can be used singly or as a mixture of two or more thereof.

Although the heat conductivity of the electric insulating layer and adhesive layer in the electrostatic chucking device of the present invention are similar to that of the conventional type because of using similar raw materials, the total thickness of the laminate sheet in the present invention may be ½ to ⅓ times that of the conventional one, since the plastic film conventionally existing on the side of the metal plate is omitted, since the electrode layer is substituted by a thin metal-deposited or metal-plated layer, and since the adhesive layer comprises one layer. Consequently, the electrostatic chucking device of the present invention have the improvement that the total heat conductivity (heat radiation ability or temperature-regulating ability) is 2 to 3 times better than that of the conventional device.

As a result of providing the thin electrode layer, the bump which conventionally exists do not exist and, thus, no cavity around outer circumference of the electrode formed due to the existence of the bump. Consequently, it is possible to set the width of the insulation area of the outer circumference as narrow as ⅓ times or less of the conventional width and, at the same time, there is no unevenness on the suction surface, thereby improving the adhesion to the semiconductor wafer and, particularly, achieving the increase and stabilization of the adhesion by suction due to improvement of heat conductivity of the outer circumference of the electrode and increase of the suction area.

The process for producing the electrostatics chucking device of the present invention will now be described. First, a metal layer is formed on one face of a heat resistant film by a depositing or plating method, and a photoresist layer is formed on the face of the metal layer. The photoresist layer may be formed by applying a liquid resist followed by drying or laminating a photoresist film (dry film) by a heat press.

Subsequently, pattern exposure, developing, etching, washing, removal or resist, and drying are carried out to form an electrode layer having a prescribed form. These operations may be carried out using a known method for forming a photoresist pattern.

On the metal face of the etched electrode layer, an adhesive is applied, dried to form a semi-cured adhesive layer, thereby producing a laminate sheet. The formed laminate sheet is subjected to punching processing according to the shape of the metal base to produce a laminate sheet for the electrostatic chucking device.

The laminate sheet for the electrostatic chucking device produced as mentioned above is then allowed to adhere to the metal base, followed by curing the adhesive layer to produce the electrostatic chucking device.

In the process of the present invention, means for providing the semi-cured adhesive layer on the surface of the electrode include the following means in addition to the above mentioned means of applying the adhesive. An adhesive sheet is previously produced by forming a semi-cured adhesive layer on a surface of a releasing film by application of the adhesive and then laminating a protective film thereon. After punched the laminate sheet and removed the protective film from the adhesive sheet just before application, the adhesive sheet is allowed to adhere to the surface of electrode layer to form a laminate sheet. Using this laminate sheet, the electrostatic chucking device of the present invention can be produced by removing the releasing film from the laminate sheet and allowing to adhere to the metal base, followed by curing the adhesive layer.

Effect of the Invention

Since the electrostatic chucking device of the present invention is formed by using a simple laminate sheet having a thin thickness, the problem associated with the use of the conventional polyimide type electrostatic chucking device is solved, and the device of the present invention exhibits excellent effects that the heat conductivity is improved, the adsorption area and adsorptity can be improved, and there is no unevenness on the wafer-provided face.

To be specific, since in the electrostatic chucking device of the present invention, the conventionally used polyimide film is used as it is, and a plated or deposited layer as a very thin electrode layer is directly formed on one face thereof without interruption with any adhesive layer, and the total thickness of the laminate sheet is drastically thinned, which drastically improves the heat conductivity, since it is directly adhered to the metal base by an adhesive. Furthermore, since the electrode layer comprises a very thin deposited or plated layer, the bump due to the electrode is never formed and, thus, the semiconductor-provided face can be flat without forming unevenness and, at the same time, cavities which are generated in the conventional electrostatic chucking device due to the fact that the unevenness cannot be filled up only by the adhesive. As a result, the width of the insulation around the outer circumference can become narrow which provides the effects that the adsorption area and adsorptity can be increased.

EXAMPLES

The present invention will be described in greater detail by referring to Example and Comparative Example. The parts used hereinbelow are based on weight.

Example 1

Onto a 50 micron thick polyimide film (Kapton, produced by Toray Dupont) was deposited aluminum in the thickness of 300 angstroms, a negative type photosensitive film (OZATEC-T538, produced by Hoechest Japan) was laminated thereon, and an electrode layer having a prescribed shape was produced by procedures of exposure, developing, etching, washing, and drying. The developing was carried out by using an aqueous 1% sodium carbonate solution which was spray-injected, the etching was carried out by using an aqueous solution comprising ferrous chloride, ferric chloride, and hydrochloric acid, which was spray-injected, and the washing was carried out by using ion-exchanged water.

Subsequently, using an adhesive having the following composition, the first application onto the surface of the electrode layer was carried out and then dried at 150° C. for 5 minutes and the second application was carried out to form an adhesive layer (insulating layer) having a film thickness of 40 microns.

| | |
|---|---|
| Acrylonitrile-butadiene rubber (Nipole 1001, produced by Nippon Zeon Co, Ltd.) | 100 parts |
| Highly pure epoxy resin (Epikoat YL979, produced by Yuka Shell Epoxy Kabushiki Kaisha) | 50 parts |
| Cresol type phenol resin (CKM 2400, produced by Showa Highpolymer Co., Ltd.) | 50 parts |
| Dicyanediamide | 5 parts |
| Methyl ethyl ketone | 500 parts |

The total thickness of the resulting laminate was 90 microns. This laminate sheet was subjected to punching processing according to a prescribed size of a aluminum base, laminated to the aluminum base. A stepwise curing from 100° to 150° C. was carried out for 5 hours to produce an electrostatic chucking device having an electrostatic chucking face with a diameter of 8 inches.

Comparative Example 1

A first adhesive layer was applied on a 50 micron thick polyimide film (Kapton, produced by Toray Dupont) in a thickness of 10 microns using the adhesive used in Example 1, dried at 150° C. for 5 minutes, a 23 micron thick copper foil was laminated thereon, and the curing was carried out under the same conditions as in Example 1. A negative photosensitive film was laminated on the copper foil face of the laminate sheet, and an electrode in a prescribed shape was produced as in Example 1.

On the other hand, a 10 micron thick second adhesive layer was separately applied on another polyimide film (Kapton, 50 microns), this was laminated on the pattern electrode face produced as described above, and curing was similarly carried out. This laminate sheet was subjected to punching processing according to a prescribed size of an aluminum base, and laminated to the aluminum base using the same adhesive as described above. The total thickness of the resulting laminate sheet was 155 microns.

Using the electrostatic chucking devices obtained from Example 1 and Comparative Example 1, the surface temperatures of the semiconductor wafer were measured. The results are shown in the follwing Table 1.

A temperature measuring plate was adhered on an Si wafer, the discharge was carried out under the following etching conditions, the temperatures of central, middle, and edge portions were measured.

The applied voltage for electrostatic adsorption was 2.0 KV.

(Etching conditions)

High frequency output applied to the electrode for the generation of plasma=1400 (W); vacuum degree in the chamber=40 (mT); packing gas in the chamber: $CHF_3$/CO=45/155 (sccm); He gas being into contact with the electrostatic chucking face (Back pressure He)=10 (Torr); temperature in the chamber (upper portion/side face/bottom portion)=60/60/20 (° C.)

(Result)

TABLE 1

|  | Central portion | Middle portion | Edge portion |
|---|---|---|---|
| Example 1 | 71–76 | 71–76 | 87–93 |
| Comparative Example 1 | 71–76 | 71–76 | 98–104 |

Note): the unit is °C.

As is clear from Table 1, it was proven that in the thin type product according to the present invention, the temperature in the face at the edge portion of the wafer was low indicating that a heat radiation effect was high.

Figure 2:
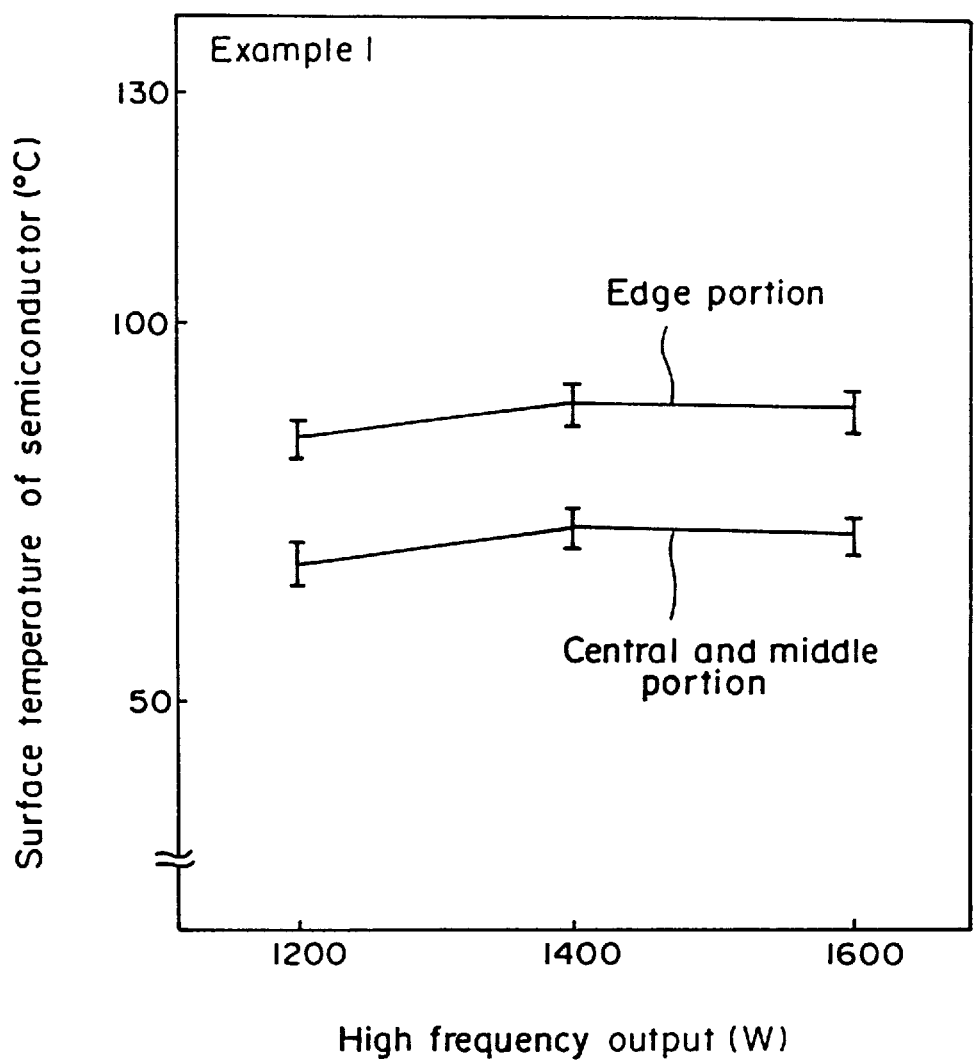
FIG. 2 is a graph showing the state of the surface temperature of the semiconductor wafer in the electrostatic chucking device according to Example 1.
Figure 3:
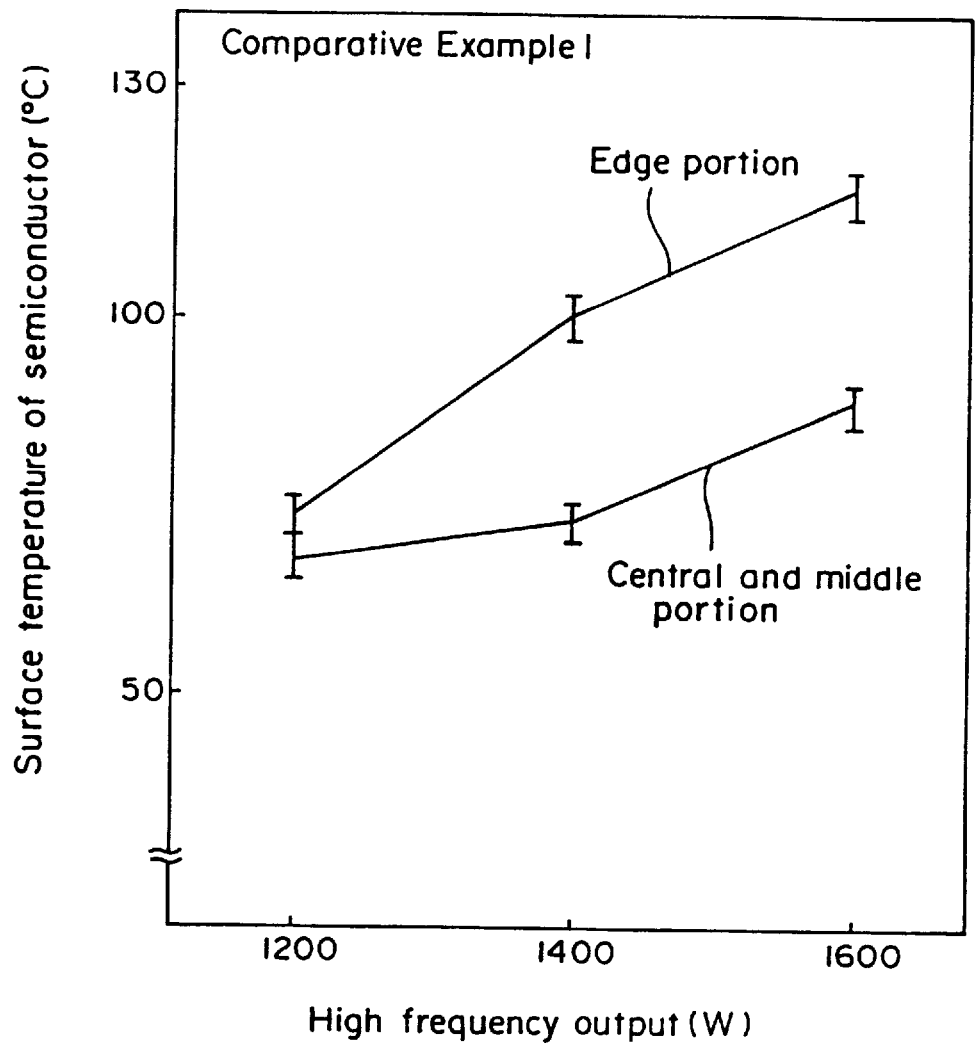
FIG. 3 is a graph showing the state of the surface temperature of the semiconductor wafer in the electrostatic chucking device according to Comparative Example 1.
Figure 4:
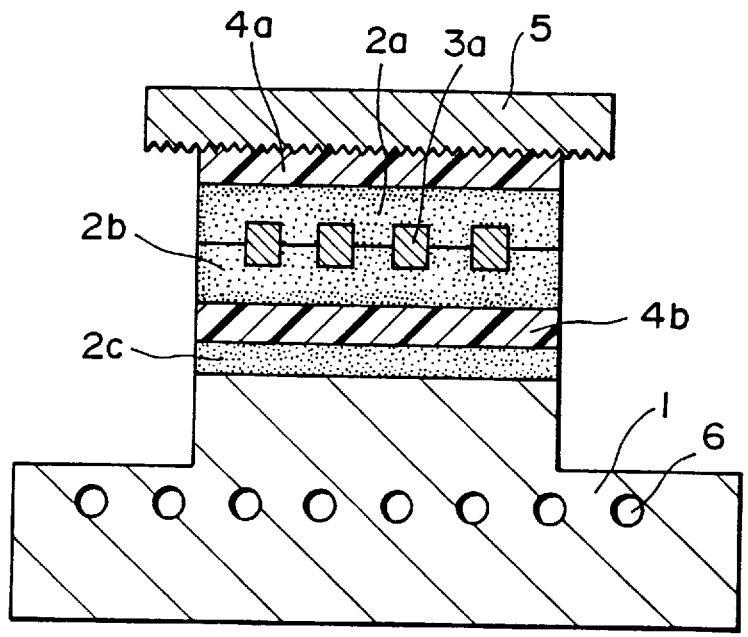
FIG. 4 is a schematic cross-sectional view showing one embodiment of the conventional electrostatic chucking device.
Figure 5:
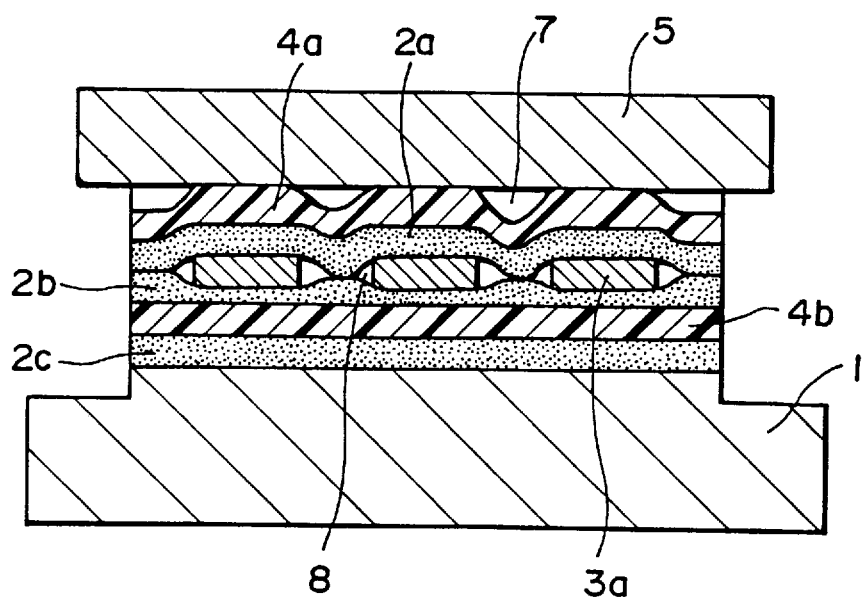
FIG. 5 is an explanation view illustrating the state that spaces and cavities are formed in the conventional electrostatic chucking device.

Similar to the above test, using high frequency output 1200 W and 1600 W, the surface temperatures of the semiconductor wafer were measured. These results are shown in FIGS. 2 and 3, together with the results in the case of the above high frequency output 1400 W.

As is clear comparison between Example 1 (FIG. 2) and Comparative Example 1 (FIG. 3), it was proven that the electrostatic chucking device of the present invention has higher heat radiation effect.

What is claimed is:

1. A process for producing an electrostatic chucking device comprising:

forming a metal layer on one face of a heat resistant film using a depositing or plating method;

forming an electrode layer by providing a photoresist layer on the surface of the metal layer, and carrying out pattern exposure, development, and etching processes;

forming a laminated sheet by forming a semi-cured adhesive layer on the surface of the electrode layer using an adhesive;

punching the laminated sheet according to the shape of a metal base; adhering the punched laminated sheet on the metal base by placing the semi-cured adhesive layer in contact with the metal base; and curing the semi-cured adhesive layer to form a laminated product.

2. A process for producing an electrostatic chucking device according to claim 1, wherein said semi-cured adhesive layer is formed by applying the adhesive to the surface of the electrode layer.

3. A process for producing an electrostatic chucking device according to claim 1, wherein said semi-cured adhesive layer is formed by forming the adhesive into a sheet of semi-cured adhesive and laminating the sheet on a surface of a releasing film.

4. A process for producing an electrostatic chucking device according to claim 1, wherein said adhesive exhibits adhesion with respect to three different materials.

5. A process for producing an electrostatic chucking device according to claim 4, wherein said three different materials are respectively included in an electric insulating layer, and electrode layer and a metal layer.

6. A process for producing an electrostatic chucking device according to claim 1, wherein said adhesive is one of a thermosetting adhesive, a two-liquid ingredient system curable adhesive, and a thermoplastic adhesive.

* * * * *